(12) United States Patent
Flaherty et al.

(10) Patent No.: US 9,277,638 B2
(45) Date of Patent: *Mar. 1, 2016

(54) GUM ROSIN PROTECTIVE COATING AND METHODS OF USE

(71) Applicant: RAYTHEON COMPANY, Waltham, MA (US)

(72) Inventors: Luke M. Flaherty, Long Beach, CA (US); Randal E. Knar, Westminster, CA (US); Tiffanie T. Randall, San Pedro, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/831,452

(22) Filed: Mar. 14, 2013

(65) Prior Publication Data

US 2014/0272113 A1 Sep. 18, 2014

(51) Int. Cl.

| | | |
|---|---|---|
| *C09D 193/04* | (2006.01) | |
| *B23K 1/20* | (2006.01) | |
| *H05K 3/28* | (2006.01) | |
| *H05K 1/02* | (2006.01) | |
| *H05K 3/00* | (2006.01) | |
| *B23K 35/36* | (2006.01) | |
| *C09D 191/00* | (2006.01) | |
| *C08L 91/00* | (2006.01) | |
| *C08L 93/04* | (2006.01) | |
| *B23K 35/02* | (2006.01) | |

(52) U.S. Cl.
CPC .. *H05K 1/02* (2013.01); *B23K 1/20* (2013.01); *B23K 35/0244* (2013.01); *B23K 35/3613* (2013.01); *C08L 91/00* (2013.01); *C08L 93/04* (2013.01); *C09D 191/00* (2013.01); *C09D 193/04* (2013.01); *H05K 3/00* (2013.01); *H05K 3/282* (2013.01); *H05K 3/288* (2013.01)

(58) Field of Classification Search
CPC .. B23K 1/20; B23K 35/3613; B23K 35/3617; H05K 3/282; H05K 3/288; C08L 93/04; C09D 193/04

USPC .................................................. 106/236–239
See application file for complete search history.

(56) References Cited

U.S. PATENT DOCUMENTS

| | | | |
|---|---|---|---|
| 3,266,949 A | 8/1966 | Groves et al. | |
| 3,448,512 A | 6/1969 | Saba | |
| 3,708,448 A | 1/1973 | Ippolito et al. | |
| 3,730,782 A | 5/1973 | Poliak et al. | |
| 4,290,824 A * | 9/1981 | Cole | 148/23 |
| 4,948,032 A | 8/1990 | Dunaway et al. | |
| 5,176,749 A | 1/1993 | Costello et al. | |
| 6,592,020 B1 * | 7/2003 | Currie et al. | 228/224 |
| 7,956,114 B2 * | 6/2011 | Flaherty et al. | 524/270 |
| 8,680,187 B2 * | 3/2014 | Flaherty et al. | 524/270 |
| 8,887,981 B2 * | 11/2014 | Flaherty et al. | 228/179.1 |
| 2009/0230175 A1 * | 9/2009 | Kawashiro | 228/223 |
| 2010/0224673 A1 | 9/2010 | Flaherty et al. | |

FOREIGN PATENT DOCUMENTS

| | | |
|---|---|---|
| EP | 2 090 622 A2 | 8/2009 |
| WO | WO 01/39922 A1 | 6/2001 |

OTHER PUBLICATIONS

Material Safety Data Sheet, Alpha No. 611 Flux (Mar. 1986).*
Written Opinion of the International Searching Authority for International Application No. PCT/US2014/011740, filed Jan. 15, 2014, Written Opinion of the International Searching Authority mailed Apr. 10, 2014 (6 pgs.).
International Search Report for International Application No. PCT/US2014/011740, filed Jan. 15, 2014, International Search Report dated Apr. 3, 2014 and mailed Apr. 10, 2014 (4 pgs.).

* cited by examiner

*Primary Examiner* — David M Brunsman
(74) *Attorney, Agent, or Firm* — Christie, Parker & Hale, LLP

(57) ABSTRACT

A rosin composition includes a gum rosin, an emulsifier, and a randomizing additive. The rosin composition may be applied to circuit cards for protection of the circuit card during storage. The rosin composition is solderable and is also easily removed for the soldering of components.

16 Claims, 8 Drawing Sheets

GUM ROSIN PROTECTIVE COATING AND METHODS OF USE

TECHNICAL FIELD

The invention is directed to gum rosin compositions and protective coatings including the compositions.

BACKGROUND

The shelf life of a circuit card (cc) assembly prior to manufacturing is about 6 months in normal processing environments. Considering that the world's electronic suppliers have expanded globally to include locations such as China and India, it is likely that a printed wiring board (PWB) may sit in transit for up to 4 months prior to reaching the circuit assembly manufacturer. Since environmental restrictions regarding use of hazardous materials have been implemented in the U.S. and Europe, lead-based paints and lead-based surface finishing of electronic devices have been replaced with lead-free versions. However, lead-free surface finishes contain high levels of tin which form tin whisker protrusions in the presence of corrosion or high levels of oxidation. These metal protrusions can transmit high levels of electrical current when bridging to adjacent circuit traces.

Printed wiring board (PWB) surface finishes require a well-defined environment and/or a long shelf life to allow for reliable solder joints. The surface finish degradation due to airborne contaminants and oxide surface formation are both significant factors in determining PWB soldering shelf life. Electroless nickel over immersion gold (ENIG) has been used in the past for military application. Commercially robust surface finishes such as immersion tin, immersion silver, Organic Solderability Preservative (OSP), and other imidazole coatings are used to form a barrier and extend the shelf life on the surface finishes to be soldered. The degree to which the soldering process is impeded depends on the degradation thickness and surface area of the OSP and the imidazole coatings. As time passes, a "worse than" condition can occur using these standard organic coatings. For OSP-coated PWBs, the plastic can be contaminated with finger oils and other manufacturing support materials that deteriorate the solderability of the coating. For non-coated PWBs, the oxide which forms on the metallized surface raises the melting point of the solder when reflow occurs. If high enough concentrations of oxide permeate the unprotected PWB, a cold solder joint will be formed and will fail prematurely. This becomes critical for fine pitch, high density components in electronic designs.

Accordingly, a protective coating to preserve the solderability of a circuit card during storage is desired to improve the manufacturing of circuit card assemblies and printed wiring boards.

SUMMARY

In some embodiments of the present invention, a rosin composition includes a gum rosin, an emulsifier, and a randomizing additive. The gum rosin may be water white gum rosin. The emulsifier may be either solvent-based or semi-aqueous, and may include polyvinyl alcohol. The randomizing additive may be selected from hydrocarbon oils, naturally occurring oils, glycols, and combinations thereof.

In some embodiments of the present invention, a method of protecting a circuit card for storage is provided, where the method includes applying a rosin composition including a gum rosin, an emulsifier, and a randomizing additive, drying the circuit card to obtain a coated circuit card, storing the circuit card, and optionally removing the rosin composition from the coated circuit card. The removal of the rosin composition may include using a soapy solution and/or an organic solvent.

BRIEF DESCRIPTION OF THE DRAWINGS

These and other features and advantages of the present invention will be better understood by reference to the following detailed description when considered in conjunction with the accompanying drawings, wherein.

DETAILED DESCRIPTION

Figure 1:
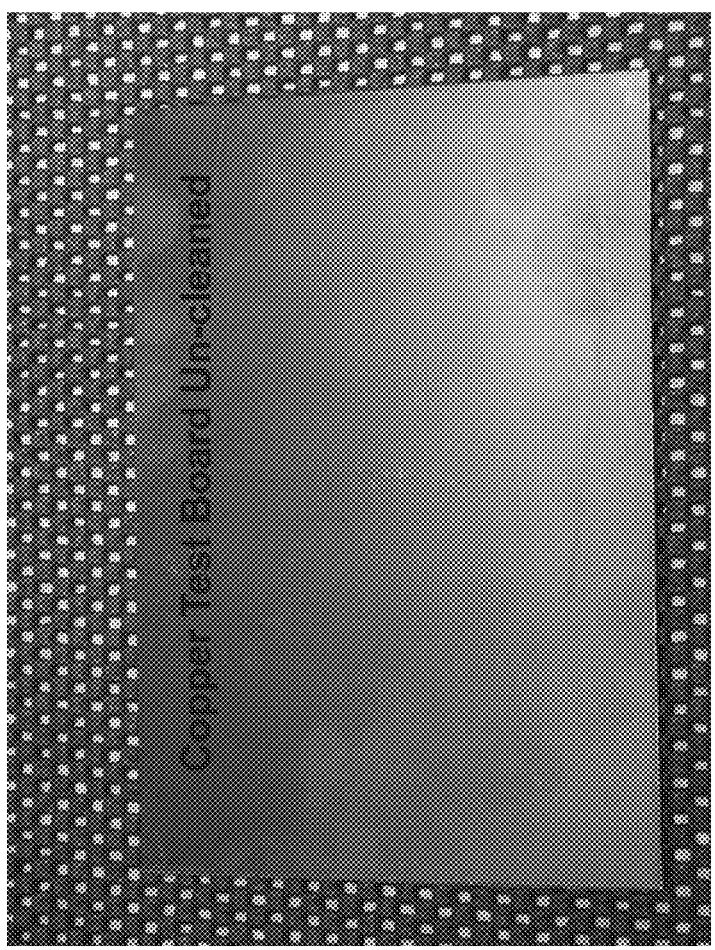
FIG. 1 is a photograph of a copper test board prior to cleaning, according to embodiments of the present invention.

In some embodiments of the present invention, a gum rosin composition is a protective coating that is effectively and easily removed. A gum rosin composition according to embodiments of the present invention includes a gum rosin, an emulsifier, and a randomizing additive. In some embodiments, the gum rosin composition has the properties of being able to coat and protect a copper test board or any part of a circuit card such that solderability is preserved during storage and/or transport. That is, the gum rosin composition not only protects, but is solderable, thereby eliminating the need to remove the coating. Additionally, the gum rosin composition disclosed herein may be removed from the board without loss of solderability. In some embodiments, a gum rosin composition of the present invention is used as a protective coating for a circuit card assembly (CCA) that preserves solderability of the circuit card.

In some embodiments, examples of gum rosins include, but are not limited to, gum rosins having the following grades: N, X, XX, W-G, and W-W. Gum rosins are available from a variety of companies, including but not limited to Alfa Aesar, Ward Hill, Mass., USA; Arizona Chemical Company, Pensacola, Fla., USA; Mead Westvaco, Richmond, Va., USA; GEA Barr-Rosin, Maidenhead Berkshire, UK: Cray Valley HSC, Paris La Defense Cedex, France; Jai Bharat Resin and Chemical, Rishikesh, India; Balram Sri Krisna Overseas, Amritsar (Punjab), India; Shanghai Xiaoxiang Chemical Company, Shanghai, China; Shanghai Polymer Commodities, Ltd., Shanghai, China; Dalian Chemical Import and Export Group Company, Dalian City (Liaoning Prov.), China; Fuzhou Farwell Import and Export Company, Fuzhou, China; Guangxi Qinzhou Capital Success Chemical Company, Qinzhou City, China; and Roveda Ind. Quim Ltda, Santa Catarina, Brazil.

In some embodiments, the gum rosin is water white gum rosin. An emulsifier of embodiments of the present invention includes solvent-based emulsifiers or semi-aqueous emulsifiers. Examples of solvent-based emulsifiers include, but are not limited to, trichloroethane, acetone isopropyl alcohol (IPA), an IPA and water combination, toluene, benzene, 2-propanol (IPA), methyl ethyl ketone (MEK), toluene/acetone/methyl ethyl ketone (MEK) and IPA combination, 1,1-dichloroethane, isoamyl acetate, cellusolve acetate, acetone, xylene, 1,1,1,1-tetrachloromethane, 1,1,2,2-tetrachloroethene, 1,1,1-trichloroethane, 1,1,2-trichloroethane, 1,1-dichloroethane, 1,1-dichloroethene, 1,2-dichloroethane, 1,2,-dichloroethene, 1,1-dichloro-1-bromoethane, 1,1-dichloro-1-bromoethene, 1-bromo-1chloro-2-chloroethene, 1,1,1-tribromoethane, 1,1,2-tribromoethene, and combinations thereof.

Examples of semi-aqueous emulsifiers include, but are not limited to, ethylene glycol in water, diethylene glycol in water, polyethylene glycol (PEG) in water, polyethylene di-glycol in water, terpene-based organic compounds in water, organic sulfate compounds in water, and combinations thereof. Non-limiting examples of organic sulfate compounds include dimethyl sulfoxide, diethyl sulfoxide, sodium methylsulfinylmethylide, trimethylsulfonium iodide, dimethylsulfoniopropionate, and methylsulfonylmethane in an emulsion of isopropyl alcohol and water.

In some embodiments, a semi-aqueous emulsifier includes polyethylene glycol (PEG) with the caveat that if the carbon chain is buttressed where the addition group is attached (multifunctional glycols), then solvency of the higher molecular weight constituents do not form emulsions. In some embodiments, a semi-aqueous emulsifier includes PEG having a molecular weight of about 5,000 daltons or less. In some embodiments, a semi-aqueous emulsifier includes PEG having a molecular weight of about 3,000 daltons or less. In some embodiments, a semi-aqueous emulsifier includes PEG having a molecular weight of 2,000 daltons or less. In some embodiments, a semi-aqueous emulsifier is an adipate derivative of PEG.

Examples of polyethylene diglycols for use as a semi-aqueous emulsifier include, but are not limited to, methyl diglycol, ethyl diglycol, diethylene glycol dibutyl ether, butyl diglycol, glycol butyl ether, allyl diglycol, and combinations thereof.

Terpene chemistry is known to work as a semi-aqueous cleaning solvent based on methyl buta-1,3 diene (hemiterpene $C_5H_8$). A terpene compound in solutions of warm water will dissolve the polymerization product of water immiscible fluxes at concentrations as low as 5 percent. Additionally, monoterpenes (C10H16): sesquiterpenes (C15H24); diterpenes (C20H32); sesterpenes (C25H40); and triterpenes (C30.H48) in solution will dissolve the polymerization product of water immiscible fluxes.

Phosphate substitutions of the isoprene will also work to dissolve the polymerization product of water immiscible fluxes. A non-limiting example of a terpene phosphate is isopentenyl pyrophosphate ($C_5H_{12}O_7P_2$)

Commercially available products of terpene (isoprene)-based cleaning solutions include: Bioact EC7R, Bioact EC7M, Axarel 36, Pinsol, Citraflor EG3, Citraflor EGS, Citraflor EGX, d-limonene FG, and d-limonene HG.

In some embodiments, a randomizing additive includes, but is not limited to, hydrocarbon oils, naturally occurring oils, and glycols. Examples of hydrocarbon oils include, but are not limited to, castor bean oil, corn oil, grape seed oil, olive oil, peanut oil, soybean oil, sunflower seed oil, walnut oil, avocado oil, flax seed oil, and combinations thereof. Examples of naturally occurring oils, include, but are not limited to, glycerin, hemp oil, jojoba oil, lanolin, tea tree oil, and wheat germ oil. Examples of glycols include, but are not limited to, polyethylene glycols (PEG), ethylene adipates, benzo-alkyl diols, and combinations thereof.

In some embodiments, a single randomizing additive may be used with the gum rosin and emulsifier. In other embodiments, however, combinations of at least two additives may be used. For example, a combination of two or more additives from the same group may be used, such as two or more hydrocarbon oils. Alternatively, in some embodiments, two or more additives from different groups may be used, such as one hydrocarbon oil and one naturally occurring oil, or one oil and one glycerol. Also, when the combination of additives includes two materials from the same group (e.g., two hydrocarbon oils), any mixing ratio may be used. Similarly, when the combination of additives includes at least two materials from different groups, any mixing ratio may be used. However, in some embodiments, when the combination includes a mixture of oils (either hydrocarbon or naturally occurring) and glycerols, the weight ratio of oil to glycerol ranges from about 5 to about 20% glycerol in oil. Longer chain oils (i.e., those having higher molecular weight) are less effective at randomizing the terpine polymer, while branched chain hydrocarbons are less effective than linear hydrocarbons. Ratios of glycerol to oil resulting in greater than about 20% glycerol in the oil, negatively affect the performance of the gum rosin composition compared to using the hydrocarbon oil by itself. In some embodiments, the mixtures of these randomizing additives are effective from about 3% to about 45% when mixed with solubilized gum rosin (i.e., gum rosin mixed with an emulsifier). Compatibilities of the randomizing additives vary in their long-term effectiveness. However, in general, for any combination or permutation of the above, the higher the concentration of the randomizing agents the longer the curing time for the protective coating.

Furthermore, the more emulsifier added to the protective base coat, the thinner the protective coating in the dried coating. In some embodiments, the amount of emulsifier in the gum rosin and emulsifier mixture is not more than about 30% by weight.

In some embodiments, a method of preparing a gum rosin coating composition includes solubilizing a gum rosin at room temperature. For example, a gum rosin is added to an emulsifier to form a solubilized gum rosin composition. The gum rosin and emulsifier are mixed in a ratio of about 4 to about 8 parts gum rosin in combination with about 1 to about 3 parts emulsifier. In some embodiments, the gum rosin and emulsifier are mixed in a ratio of about 8 parts gum rosin to about 2 parts emulsifier. The solubilized gum rosin composition is then combined with a randomizing additive. After addition of the randomizing additive, the solubilized gum rosin and randomizing additive composition is heated in a range from about 30 to about 90° C., and/or exposed to electromagnetic power sources. Exposure to electromagnetic power forms a quasi-prepolymer gum rosin coating composition. A quasi prepolymer is a mixture of a partially reacted polymer with excess resin which is combined with an active curing agent or curative rich prepolymer. The net result is a polymer structure that increases in molecular weight forming either a glue or a plastic.

In some embodiments, an optional surface stabilizer is added to the quasi-prepolymer gum rosin composition. A surface stabilizer may decrease the tackiness of the gum rosin composition. Examples of a surface stabilizer include, but are not limited to fluoro surfactants such as Dupont's Zonyl 8857A and fluoro surfactants such as Omnova PolyFox PF-651.

In some embodiments, the gum rosin composition according to embodiments of the present invention includes a gum rosin, an emulsifier, a randomizing additive, as well as a filler. A filler may be added to increase the viscosity of the composition and make the composition more thixotropic. The filler may be a material that is either reactive or non-reactive to the polymer chemistry. Non-limiting examples of a reactive material filler include the addition of boric acid or succinic acid to the polyvinyl alcohol. Non-limiting examples of a non-reactive material filler include fumed silica (CAB-O-SIL®), cut glass fiber, aluminum oxide, fine powdered ceramics, non-conductive carbon nanotubes (CNT), carbon geodesic balls (Buckyballs or fullerenes), natural organic based fine nut shell particles (particles of nut shells), synthetic organic fine particles (finely ground nylon 66 or derivative), finely ground glass beads (silica dioxide), and inorganic non-reactive fine powders (potassium sulphate). In some embodiments, the filler used in the gum rosin coating composition is thermally stable up to about 240° C.

Figure 2:
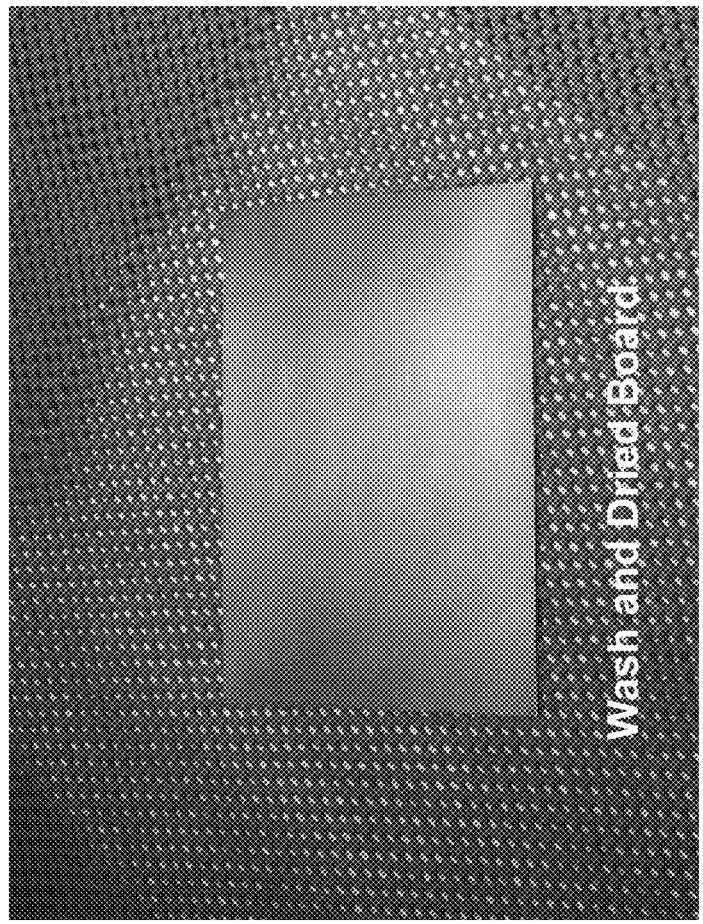
FIG. 2 is a photograph of a cleaned, rinsed, and dried copper test board.
Figure 3:
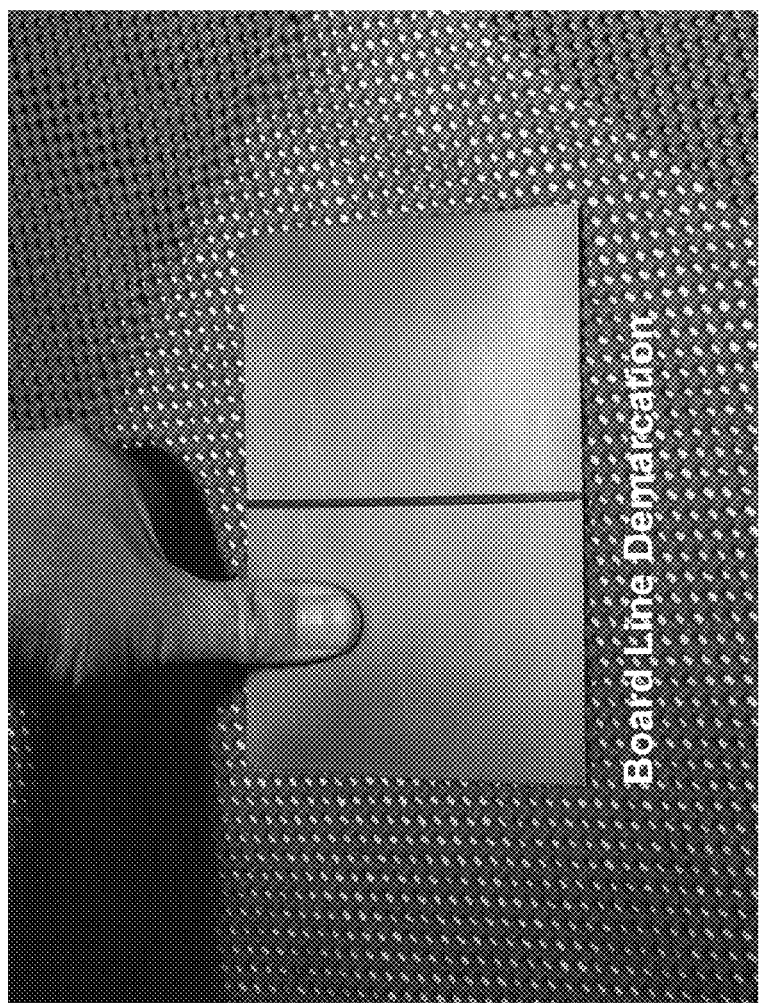
FIG. 3 is a photograph of one of two thumb prints being placed on the left side of the demarcated, clean, copper test board.
Figure 4:
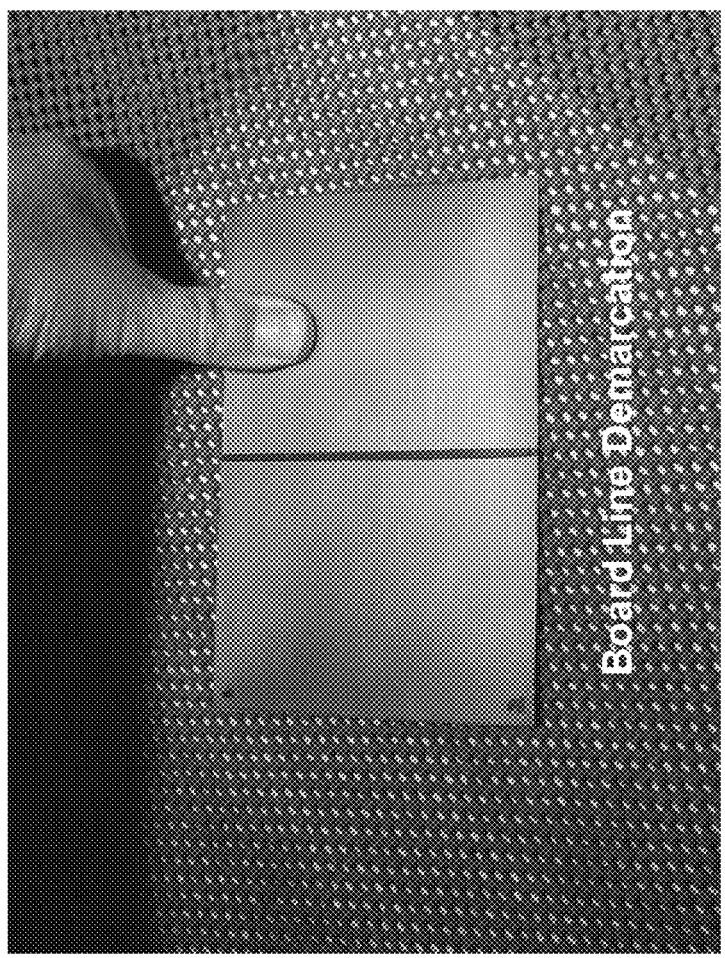
FIG. 4 is a photograph of one of two thumb prints being placed on the right side of demarcated, clean, copper test board.
Figure 5:
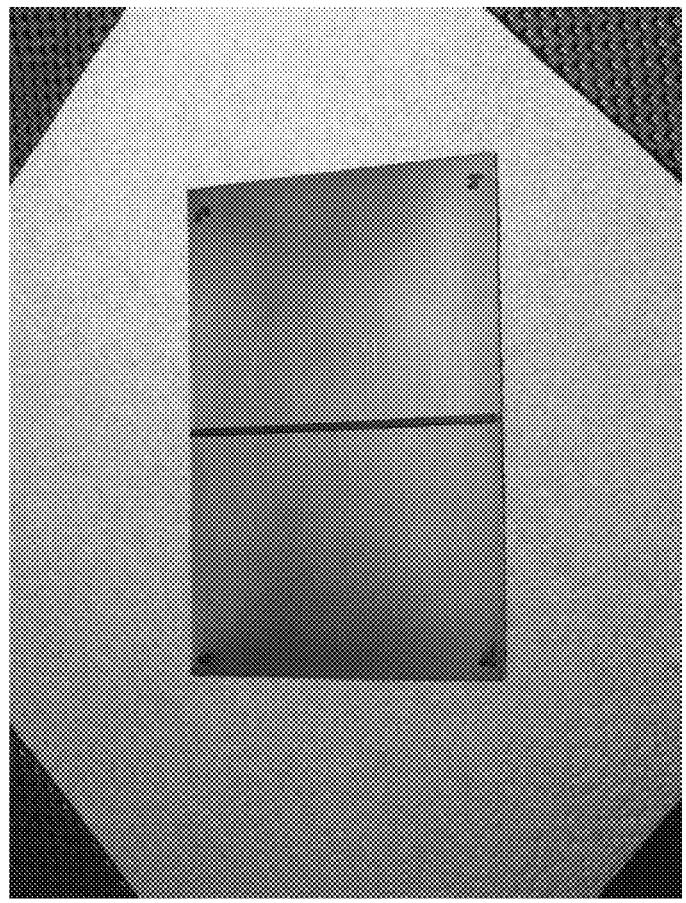
FIG. 5 is a photograph of the copper test board of FIG. 4, after a gum composition has been applied to one side of the demarcated copper test board, according to embodiments of the present invention.

In some embodiments, a gum rosin coating composition of the present invention may be applied as a protective coating. For example, a gum rosin coating composition of the present invention may be applied to a printed wiring board (PWB) prior to assembly of a circuit card assembly (CCA). An example copper test board is shown prior to cleaning in FIG. 1, and after cleaning and drying in FIG. 2. FIGS. 3 and 4 show a copper test board being marked with thumb prints for comparison of the solderability of the board, and FIG. 5 shows the copper test board after application of the coating onto the surface of the left side (e.g., by brushing). The coated surface is cured (i.e., allowed to dry) at room temperature or with heating up to about 60° C. for about 2 hours. In some embodiments, partially assembled PWBs are coated with the gum rosin composition of the present invention to protect both components and boards in mid-process applications.

Figure 6:
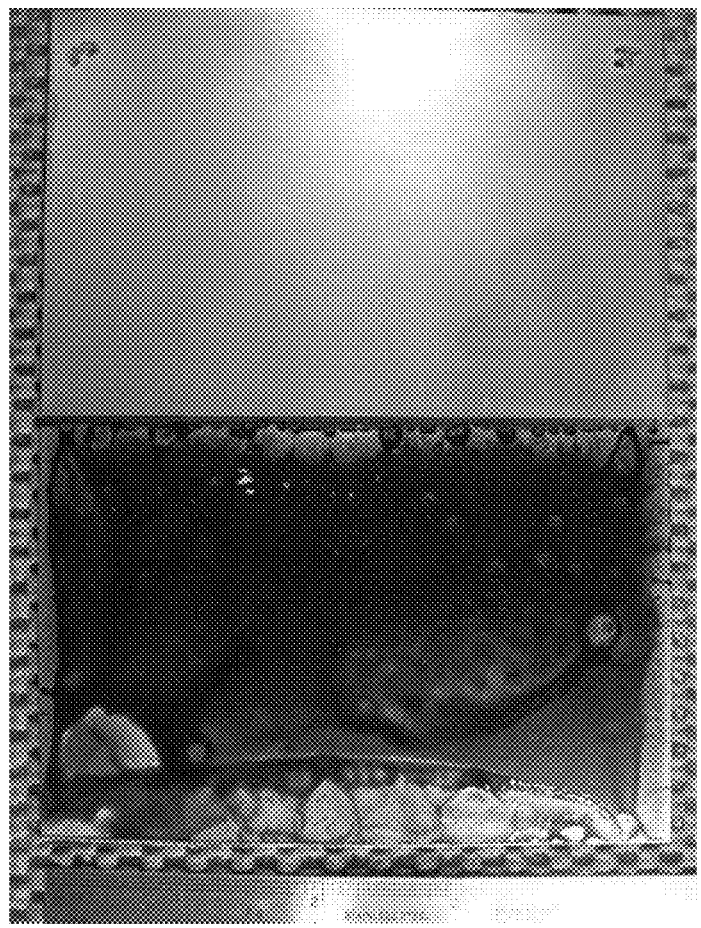
FIG. 6 is a photograph of the copper test board of FIG. 5, after a gum composition has been applied to one side and the copper test board has aged for 8 months at room temperature with 30 to 50% humidity, according to embodiments of the present invention.

A PWB coated with a gum rosin composition as disclosed herein, may be placed in storage. This coated PWB may be in storage, for example, for up to approximately one year. FIG. 6 shows the copper test board of FIG. 5 after 8 months at room temperature at 30-50% humidity.

Figure 7:
FIG. 7 is a photograph of a cleaned copper test board of FIG. 6, after a gum composition has been applied to the left side, and the copper test board has aged for 8 months at room temperature with 30 to 50% humidity, according to embodiments of the present invention.
Figure 8:
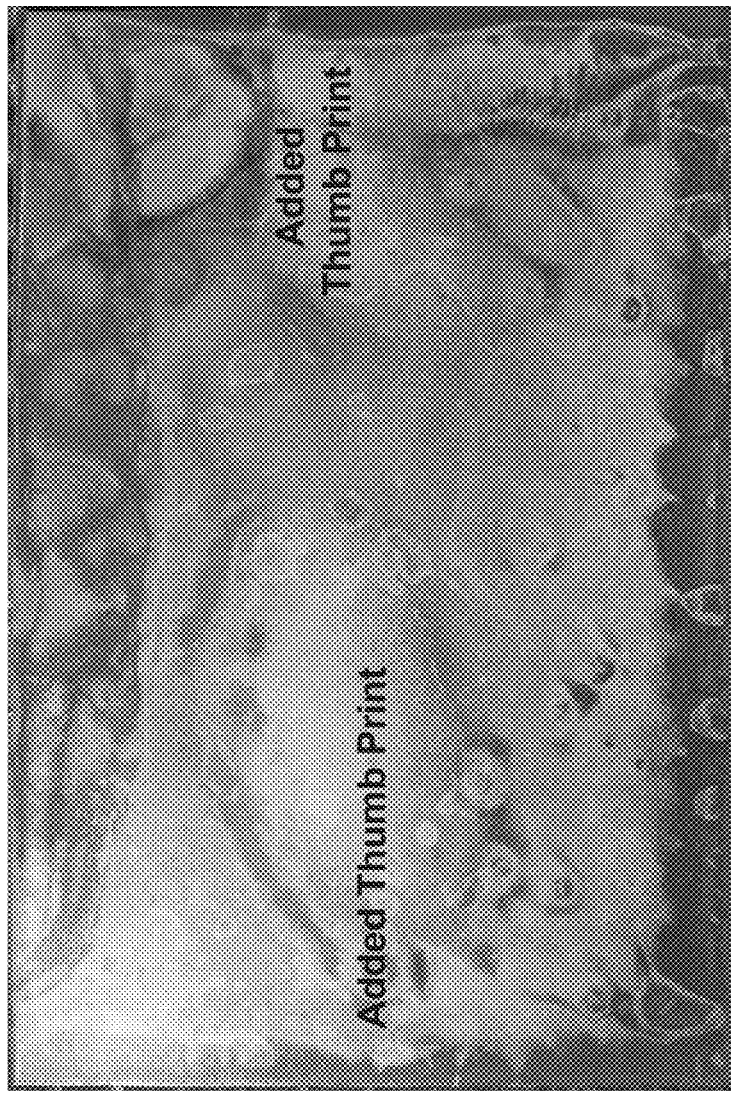
FIG. 8 is a photograph of the solderable copper test board of FIG. 7, after 8 months of aging, according to embodiments of the present invention.

In some embodiments, after removal from storage, the protective coating is removed from the PWB. According to embodiments of the present invention, a protective coating that has been applied to a surface may be solvated by immersion in a soapy water solution. In some embodiments, the soapy water solution includes an industrial detergent. Examples of an industrial detergent include Kyzen detergents, for example, Kyzen 4615 (Aquanox®, Kyzen Corp., Nashville, Tenn.). In some embodiments, the disclosed protective coating is removed in a soapy water solution of 12% Kyzen 4615. In some embodiments, the removal using a soapy water solution also includes heating up to about 65 to 70° C. FIGS. 7 and 8 show the copper test board of FIG. 6 after cleaning with Kyzen 4615. The left side of FIG. 7 which is shown in a closer view in FIG. 8, shows that the left side which had the protective coating is solderable.

Alternatively, for water-sensitive device applications that have been assembled, the protective coating may be solvated from a surface using solvents such as trichloroethane, acetone, toluene, benzene, 2-propanol (IPA), and tetrachlorofluoroethane (i.e., freon). After removal of the protective coating, the PWB is rinsed with de-ionized water, and then a flux is applied as necessary for the soldering of components.

In other embodiments, the gum rosin protective coating composition is adjusted such that the disclosed gum rosin flux/emulsifier/randomizing agent mixture is in a range from about 20 to about 100% by weight with the remaining components including an aqueous solvent or organic polymer solvent. An acrylic or modified acrylate-urethane coating has demonstrated good protective oxygen barrier performance. However, using such materials as polystyrene or other carbonyl modified polymer materials can be added in lower concentrations to the gum rosin flux composition in order for the protective coating to remain "cleanable" (i.e., removable).

In other embodiments of the present invention, the gum rosin protective coating composition as disclosed herein is applied and not removed before soldering. That is, the gum rosin protective coating composition as disclosed is capable of being soldered, thereby eliminating the step of removing the protective coating.

The following Example is presented for illustrative purposes only, and does not limit the scope or content of the present application.

EXAMPLE

Isopropyl alcohol (emulsifier) was mixed with water white gum rosin at a ratio of 2 parts IPA to 8 parts water white gum rosin. This rosin and IPA mixture was stirred and heated at 23° C. to 30° C. for 2 hours. 1 part grape seed oil was added to 9 parts IPA gum rosin mixture to form a coat protective mixture. The coat protective mixture was coated onto a copper test substrate and allow to air dry overnight (FIG. 5). The copper test board was stored for 8 months at 30-50% humidity at room temperature. Following 8 months of storage, the protective coating was removed from the coated side of the copper test board with a soapy water solution of 12% Kyzen 4615 (Kyzen Corp., Nashville, Tenn.) heated to 65° C. and the coating was brushed off into the cleaning solution. The copper test board was then rinsed with de-ionized water. Components can now be soldered to this board.

As disclosed herein, and for example, as shown in FIGS. 7-8, a water white gum rosin composition according to embodiments of the present invention, is an effective coating that can be removed leaving a solderable surface. This protective coating can act as an oxygen and moisture barrier to protect bare copper, solder or other shelf-life sensitive material on the surface of, for example a PWB. As disclosed and shown herein, (e.g. FIG. 6), the protective coating remains on the surface of the PWB after fabrication, and can remain on the surface, for example, through shipment and in storage at the CCA manufacturer's site until assembly is required. When necessary (e.g., for the soldering of components), the protective coating on the surface of the PWB is easily removed by an aqueous or organic solvent. The cleaned surface is highly active with low amounts of oxygen content or other contaminants. This protective coating composition provides for a much higher first pass yield and lower filed unit failure in the manufacturing of CCAs.

While the present invention has been illustrated and described with reference to certain exemplary embodiments, those of ordinary skill in the art will understand that various modifications and changes may be made to the described embodiments without departing from the spirit and scope of the present invention, as defined in the following claims.

What is claimed is:

1. A rosin composition, comprising:
   a gum rosin;
   an emulsifier selected from the group consisting of polyethylene glycols (PEG) in water, terpenes and phosphate-substituted terpenes selected from the group consisting of hemiterpenes, monoterpenes, sesquiterpenes, diterpenes, sesterpenes, and triterpenes, organic sulfate compounds in water, and combinations thereof;
   a filler; and
   a randomizing additive.

2. The rosin composition of claim 1, wherein the gum rosin is a water white gum rosin.

3. The rosin composition of claim 1, wherein the PEG in water has a molecular weight of about 5,000 daltons or less.

4. The rosin composition of claim 1, wherein the randomizing additive is selected from the group consisting of hydrocarbon oils, naturally occurring oils, glycerols, and combinations thereof.

5. The rosin composition of claim 1, wherein the randomizing additive is selected from the group consisting of castor bean oil, corn oil, grape seed oil, olive oil, peanut oil, soybean oil, sunflower seed oil, walnut oil, glycerin, hemp oil, jojoba, lanolin, tea tree oil, wheat germ oil, polyethylene glycol, ethylene adipate, and benzo-alkyl diol.

6. The rosin composition of claim 1, wherein the gum rosin and the emulsifier are mixed in a ratio of about 4 to about 8 parts gum rosin to about 1 to about 3 parts emulsifier.

7. The rosin composition of claim 1, wherein the randomizing additive is present in an amount ranging from about 3 to about 45% by weight.

8. The rosin composition of claim 1, wherein the randomizing additive is present in an amount of about 10% by weight.

9. The rosin composition of claim 1, wherein the filler is selected from the group consisting of hydrated sodium borate, boric acid, succinic acid, fumed silica, cut glass fiber, aluminum oxide, fine powdered ceramics, non-conductive carbon nanotubes (CNT), carbon geodesic balls, nut shell particles, ground nylon 66, a derivative of nylon 66, ground silica dioxide, potassium sulphate, and mixtures thereof.

10. A method of protecting a circuit card for storage, the method comprising:
    applying the rosin composition according to claim 1 on the circuit card;
    drying the circuit card to obtain a coated circuit card; and
    removing the rosin composition from the coated circuit card.

11. The method of claim 10, wherein the removing of the rosin composition comprises using a soap solution or an organic solvent.

12. The method of claim 11, wherein the removing of the rosin composition comprises using an organic solvent selected from the group consisting of trichloroethane, acetone, toluene, benzene, isopropyl alcohol, tetrachlorofluoroethane, and combinations thereof.

13. The method of claim 11, wherein the removing of the gum rosin composition comprises using a detergent.

14. A method of protecting a circuit card for storage, the method comprising:
    applying the rosin composition according to claim 1 on the circuit card;
    drying the circuit card to obtain a coated circuit card; and
    soldering the coated circuit card.

15. The method of claim 14, further comprising storing the coated circuit card for up to one year.

16. A rosin composition, consisting of:
    a gum rosin;
    an emulsifier selected from the group consisting of polyethylene glycols (PEG) in water, polyethylene diglycols, terpenes and phosphate-substituted terpenes selected from the group consisting of hemiterpene, monoterpenes, sesquiterpenes, diterpenes, sesterpenes, triterpenes, organic sulfate compounds in water, and combinations thereof;
    a filler selected from the group consisting of hydrated sodium borate, boric acid, succinic acid, fumed silica, cut glass fiber, aluminum oxide, fine powdered ceramics, non-conductive carbon nanotubes (CNT), carbon geodesic balls, nut shell particles, ground nylon 66, a derivative of nylon 66, ground silica dioxide, potassium sulphate, and mixtures thereof; and
    a randomizing additive selected from the group consisting of hydrocarbon oils, naturally occurring oils, glycerols, and combinations thereof.

* * * * *